United States Patent
Ning et al.

(10) Patent No.: US 12,250,809 B2
(45) Date of Patent: Mar. 11, 2025

(54) ONE-TIME PROGRAMMABLE MEMORY CELL AND MEMORY THEREOF

(71) Applicant: Chengdu Analog Circuit Technology Inc., Sichuan (CN)

(72) Inventors: Dan Ning, Sichuan (CN); Yulong Wang, Sichuan (CN)

(73) Assignee: Chengdu Analog Circuit Technology Inc., Chengdu (CN)

( * ) Notice: Subject to any disclaimer, the term of this patent is extended or adjusted under 35 U.S.C. 154(b) by 226 days.

(21) Appl. No.: 18/301,473

(22) Filed: Apr. 17, 2023

(65) Prior Publication Data

US 2023/0422494 A1    Dec. 28, 2023

(30) Foreign Application Priority Data

Jun. 23, 2022   (CN) ......................... 202210724399.2
Aug. 31, 2022   (CN) ......................... 202211053131.7

(51) Int. Cl.
  *G11C 17/16*   (2006.01)
  *H01L 23/525*  (2006.01)
  *H10B 20/25*   (2023.01)

(52) U.S. Cl.
  CPC ............. *H10B 20/25* (2023.02); *G11C 17/16* (2013.01); *H01L 23/5252* (2013.01)

(58) Field of Classification Search
  CPC ........ H10B 20/25; H10B 20/20; G11C 17/16; G11C 17/18; G11C 17/08; H01L 23/5252
  USPC .......................................................... 365/96
  See application file for complete search history.

(56) References Cited

U.S. PATENT DOCUMENTS

| | | | |
|---|---|---|---|
| 11,189,357 B1* | 11/2021 | Huang | ................... H10B 20/25 |
| 2013/0264621 A1* | 10/2013 | Nishi | ................... H10B 12/056 |
| | | | 257/E21.409 |
| 2018/0269209 A1* | 9/2018 | Tan | ................... H01L 29/7883 |
| 2024/0014314 A1* | 1/2024 | Tsai | ................... H10D 84/0135 |

\* cited by examiner

*Primary Examiner* — Huan Hoang
*Assistant Examiner* — Minh Dinh
(74) *Attorney, Agent, or Firm* — Hodgson Russ LLP

(57) ABSTRACT

The present disclosure provides an anti-fuse type one-time programmable memory cell. The memory cell includes a selection transistor and a gate capacitor, which are connected in series and located in a substrate, the substrate including an active region and an isolation region; in which the gate capacitor includes a gate, a gate oxide layer between the gate and the substrate, and an ion-doped region beneath the gate oxide layer, the ion-doped region being located in the active region in the substrate and overlapping with a part of a lower surface of the gate oxide layer; in which a part of the lower surface of the gate oxide layer that does not overlap with the ion-doped region completely overlaps with the isolation region in the substrate, and the ion-doped region and the isolation region are seamlessly adjacent to each other in the substrate beneath the gate oxide layer.

18 Claims, 9 Drawing Sheets

| Mode of Operation | Memory Cell | WL | BL | PL | LVPW and MVPW |
|---|---|---|---|---|---|
| Programming Unit 101 | 101 | 5.0v | 0v | 4.0v | 0v |
| | 102 | 0v | 0v | 4.0v | 0v |
| | 103 | 5.0v | 0v | 0v | 0v |
| | 104 | 0v | 0v | 0v | 0v |
| Reading Unit 101 | 101 | 1.5v | 1.5v | 0v | 0v |
| | 102 | 0v | 1.5v | 0v | 0v |
| | 103 | 1.5v | 0v | 0v | 0v |
| | 104 | 0v | 0v | 0v | 0v |
FIG. 7
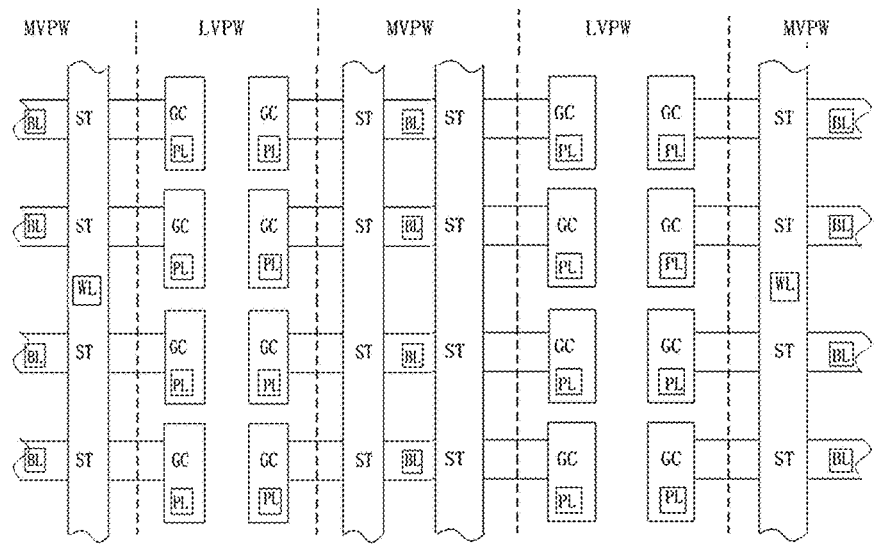
FIG. 8
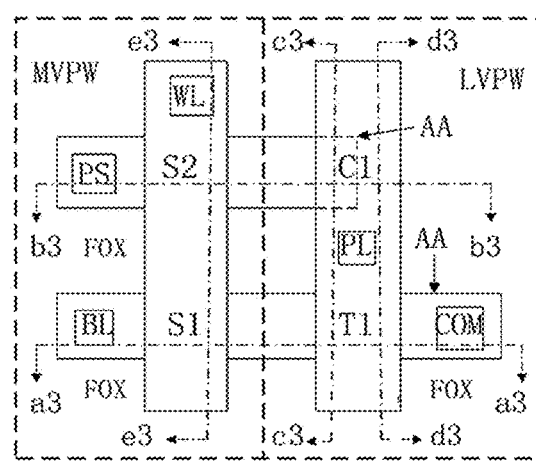
FIG. 9

| Mode of Operation | Memory Cell | WL | BL | PL | PS | COM | LVPW and MVPW |
|---|---|---|---|---|---|---|---|
| Programming Unit 101 | 101 | 5.0v | 1.5v | 4.0v | 0v | 1.5v | 0v |
| | 102 | 0v | 1.5v | 4.0v | 0v | 1.5v | 0v |
| | 103 | 5.0v | 1.5v | 0v | 0v | 1.5v | 0v |
| | 104 | 0v | 1.5v | 0v | 0v | 1.5v | 0v |
| Reading Unit 101 | 101 | 1.5v | 1.5v | Floating | 1.0v | 0v | 0v |
| | 102 | 0v | 1.5v | Floating | 1.0v | 0v | 0v |
| | 103 | 1.5v | 0v | Floating | 0v | 0v | 0v |
| | 104 | 0v | 0v | Floating | 0v | 0v | 0v |

ONE-TIME PROGRAMMABLE MEMORY CELL AND MEMORY THEREOF

CROSS-REFERENCE TO RELATED APPLICATIONS

This application claims priority to Chinese Patent Application Serial No. 202211053131.7, filed Aug. 31, 2022, and Chinese Patent Application Serial No. 202210724399.2, filed Jun. 23, 2022. The entire disclosures of the above-identified applications are incorporated herein by reference.

FIELD

The present disclosure relates to a non-volatile memory cell and a memory thereof, especially to a one-time programmable non-volatile memory cell and a memory thereof, in particular to an anti-fuse type one-time programmable non-volatile memory cell and a memory thereof.

BACKGROUND

A non-volatile memory has advantages in that stored data does not disappear even if power is turned off, and data may be maintained for a long time. Therefore, it is widely used in an electronic device.

The non-volatile memory is divided into a multi-time erasable programmable memory and a one-time programmable (OTP) memory. A memory cell of the multi-time erasable programmable memory is generally large in area, does not meet requirements of mass storage, and is costly. Therefore, the one-time programmable (OTP) memory is very popular in some applications and markets.

SUMMARY

A first aspect of the present disclosure relates to a first one-time programmable memory cell, including a selection transistor and a gate capacitor, which are connected in series and located in a substrate, the substrate including an active region and an isolation region, in which the gate capacitor includes a gate, a gate oxide layer between the gate and the substrate, and an ion-doped region beneath the gate oxide layer, the ion-doped region being located in the active region in the substrate and overlapping with a part of a lower surface of the gate oxide layer, in which a part of the lower surface of the gate oxide layer that does not overlap with the ion-doped region completely overlaps with the isolation region in the substrate, and the ion-doped region and the isolation region are seamlessly adjacent to each other in the substrate beneath the gate oxide layer.

In an embodiment, the selection transistor has a drain and a source, the gate capacitor has an ion-doped region, and the source of the selection transistor merges with the ion-doped region of the gate capacitor.

In another embodiment, the selection transistor has a drain and a source, the gate capacitor has two ion-doped regions, and the source of the selection transistor merges with one ion-doped region of the gate capacitor, the two ion-doped regions of the gate capacitor overlap with a part of the lower surface of the gate oxide layer, respectively, are separated by the isolation region, and are both seamlessly adjacent to the isolation region. More specifically, the two ion-doped regions of the gate capacitor are connected via a metal line.

In another embodiment, a thickness of the gate oxide layer of the gate capacitor is less than that of a gate oxide layer of the selection transistor.

In yet another embodiment, the selection transistor is an NMOS transistor, and the ion-doped region of the gate capacitor is an N-type doped region.

A second aspect of the present disclosure relates to a one-time programmable memory, including at least one memory cell according to embodiments of the present disclosure as described above, forming an array of multiple rows by multiple columns, and substrates of all memory cells merging together, in which any two adjacent memory cells in each row are arranged in a left-right mirror symmetry, in which two adjacent selection transistors share a drain, and two adjacent gate capacitors are not in contact with each other, selection transistors of all memory cells in each column are aligned in an up-down direction, gates of the selection transistors being integrated.

In an embodiment, the memory further includes a bit line in each row connected to a drain of a selection transistor of each memory cell in the row, a programming line in each row connected to a gate of a gate capacitor of each memory cell in the row, and a word line in each column connected to a gate of a selection transistor of each memory cell in the column.

A third aspect of the present disclosure relates to a second one-time programmable memory cell, based on the memory cell according to the first memory cell as described above, further includes a first selection transistor and a detection transistor, which are connected in series and located in a substrate, in which the selection transistor in the first memory cell is called a second selection transistor, which is connected in series with the gate capacitor, the detection transistor and the gate capacitor share a gate.

In an embodiment, in which a thickness of gate oxide layers of the detection transistor and the gate capacitor is less than that of gate oxide layers of the two selection transistors.

In another embodiment, the two selection transistors are of the same type as the detection transistor. More specifically, the two selection transistors and the detection transistor are NMOS transistors, and the ion-doped region beneath the gate oxide layer of the gate capacitor is an N-type doped region.

In yet another embodiment, the first selection transistor and the second selection transistor share a gate.

A fourth aspect of the present disclosure relates to a one-time programmable memory cell group, including four memory cells according to the second memory cell as described above, arranged in a centrosymmetric array of 2 rows by 2 columns, and substrates of all memory cells merging together, in which two memory cells in each row are arranged in a left-right mirror symmetry, in which two detection transistors of two memory cells share a source, and have drains each merging with a source of a first selection transistor in a respective memory cell, two gate capacitors are left-right adjacent to each other in the middle of the row without being contacted with each other, and one ion-doped region of each gate capacitor merges with a source of a second selection transistor in a respective memory cell, two selection transistors in one memory cell are located at one side of the group, and two selection transistors in another memory cell are located at the other side of the group, and two memory cells in each column are arranged in an up-down mirror symmetry, all selection transistors in the column being aligned in an up-down direction, and gates of two second selection transistors or two first selection transistors adjacent to each other in the up-down direction in the two memory cells being connected.

In an embodiment, the four memory cells in the group have a same structure, composition and ingredient.

In another embodiment, the memory cell group further includes a common line in each row connected to a shared source of two detection transistors in the row, a bit line in each row connected to a drain of a first selection transistor of each memory cell in the row, a programming bottom line in each row connected to a drain of a second selection transistor of each memory cell in the row, a programming line in each row connected to a shared gate of the gate capacitor and the detection transistor of each memory cell in the row, and two word lines in each column respectively connected to two gates of first and second selection transistors in each memory cell in the column, or one word line in each column connected to a shared gate of first and second selection transistors in each memory cell in the column.

A fifth aspect of the present disclosure relates to a one-time programmable memory, including at least one memory cell group according to embodiments of the present disclosure as described above, forming an array, an arrangement manner of groups in the array being same, and substrates of the memory cells of groups merging together to form a substrate of the array, in which two adjacent groups in each row, two first selection transistors adjacent to each other in a left-right direction share a first drain, and two second selection transistors adjacent to each other in the left-right direction share a second drain, in two adjacent groups in each column, gates of two adjacent second selection transistors or two adjacent first selection transistors aligned in an up-down direction are connected, a common line, a bit line, a programming bottom line, and programming line of each group in each row are connected to form a common line, a bit line, a programming bottom line, and a programming line of the row, respectively, and one or two word lines of groups in each column are respectively connected or concatenated to form one or two word lines of the column.

In an embodiment, in the array, a structure, a composition, and an ingredient of groups are all identical.

BRIEF DESCRIPTION OF THE DRAWINGS

FIG. 7 shows bias signals connected to the array shown in FIGS. 5-6 during different operations.

FIG. 8 shows a top view of an array of multiple rows by multiple columns of the memory cells shown in FIG. 1.

FIG. 9 shows a top view of a second memory cell according to an embodiment of the present disclosure.

DETAILED DESCRIPTION

Figure 1:
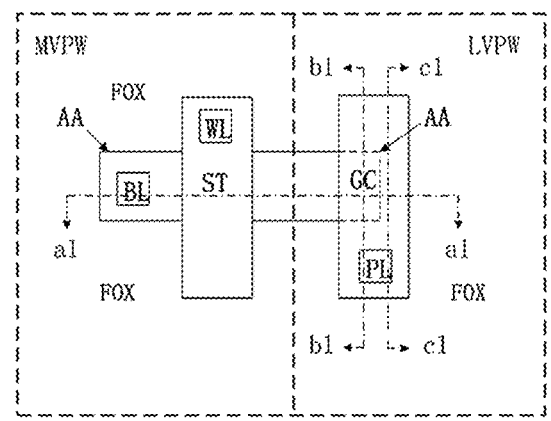
FIG. 1 shows a top view of a first memory cell according to an embodiment of the present disclosure.

Like numbers in the accompanying drawings refer to similar elements.

Embodiments of the present disclosure are illustrated by way of example, and are not limited to examples shown in the accompanying drawings. It is to be understood that the accompanying drawings only show some embodiments of the present disclosure, so they should not be regarded as limiting the scope. For those skilled in the art, other related embodiments and their accompanying drawings may also be obtained from these accompanying drawings without creative labor.

The one-time programmable memory may be divided into a floating gate type OTP memory, an electric fuse type OTP memory, and an anti-fuse type OTP memory according to its characteristics. The floating gate type OTP memory cell realizes the switching between high and low resistance states by changing a threshold voltage of a device after electrons or holes are injected into a floating gate. The electric fuse type OTP memory cell is in a storage state of a low resistance value when it is not programmed, and in a storage state of a high resistance value after it is programmed, which is usually realized based on the electromigration of a polysilicon gate. The anti-fuse type memory cell is in a storage state of a high resistance value when it is not programmed, and in a storage state of a low resistance value after it is programmed.

The floating gate type OTP memory compatible with a standard process requires that a thickness of a gate oxide layer of an I/O device is greater than 65 A for better data retention. A process of 90 nm or above may meet the requirement that the thickness of the gate oxide layer is greater than 65 A. However, on a process platform of 55 nm/40 nm or below, a thickness of a gate oxide layer of an I/O device of 2.5V or below is less than 60 A. On these process platforms, the floating gate type OTP memory cannot guarantee good data retention, so it cannot be fully compatible with the standard process, and it is hardly applied to more advanced processes. In addition, as a semiconductor fabrication process continue to shrink, electrons or holes captured by the floating gate type OTP memory in the advanced processes may easily leak, resulting in data loss.

The electric fuse type OTP memory is limited to the polysilicon gate, which is limited in use if a metal gate is used instead of the polysilicon gate in the advanced processes.

The anti-fuse type OTP memory is programmed based on the mechanism of physical breakdown of the gate oxide layer, there is no risk of electron or hole leakage, and its breakdown mode is irreversible, so it has better reliability. It is not restricted by the polysilicon gate and has high compatibility with the advanced processes. As a result, it has received a lot of attention and has been well developed in recent years.

At present, there is a continuous need in the industry for an anti-fuse type OTP memory that is optimized in structure and performance, especially for an anti-fuse type OTP memory that has high programming efficiency, fast programming and reading speed, and low power consumption.

A memory cell and a memory thereof according to embodiments of the present disclosure may be prepared by a process compatible with advanced standard processes, may quickly and efficiently implement programming in a breakdown mode, with a low breakdown voltage and stable and reliable performance, and also has low power consumption, fast programming and reading speed, and high reading sensitivity.

The present disclosure provides two anti-fuse type one-time programmable (OTP) memory cells, and arrays or memories thereof.

A first anti-fuse type one-time programmable (OTP) according to embodiments of the present disclosure includes a selection transistor and a gate capacitor, which are connected in series and located in a substrate.

An ion-doped region of the gate capacitor merges with a source of the selection transistor. In a programming operation, the selection transistor is turned on, so that a low potential is applied to the ion-doped region beneath a gate oxide layer of the gate capacitor through the selection transistor connected in series therewith. At the same time, a high potential is applied to a gate of the gate capacitor, and the gate oxide layer of the gate capacitor breaks down under the action of a voltage difference between two sides thereof.

In a reading operation, the selection transistor is turned on, and a potential higher than that of a drain of the selection transistor is applied to the gate of the gate capacitor. For a memory cell that has been programmed in a breakdown mode, a read current is generated from the source to the drain of the selection transistor of the memory cell.

The substrate includes an active region (AA) and an isolation region (FOX). The source and drain of the transistor and the ion-doped region of the gate capacitor are both located in the active region. The active region is adjacent to the isolation region. When there are several active regions in the substrate, adjacent active regions are separated by the isolation region. The isolation region is also called a shallow trench isolation region, which is filled with thick field oxide. The isolation region surrounds the selection transistor and the gate capacitor.

In an embodiment, there is a well in the substrate, which may be a P-well (PW), or an N-well (NW), specifically a P-well. In a case of a well in the substrate, the above-mentioned active region and the isolation region are located in the well.

The gate capacitor may have one, or two ion-doped regions.

When the gate capacitor has one ion-doped region, the source of the selection transistor merges with the ion-doped region. The ion-doped region horizontally extends to a side of the gate capacitor that does not contain an N-type ion-doped region within the active region in the substrate or the P-well until it overlaps with a part of a lower surface of the gate oxide layer of the gate capacitor. The isolation region (FOX) horizontally extends beneath the gate oxide layer of the gate capacitor from a side of the gate capacitor that does not contain an N-type ion-doped region in the substrate or the P-well on the substrate, and overlaps with respectively a part of the lower surface of the gate oxide layer of the gate capacitor until it is seamlessly joined with the N-type ion-doped region that extends in an opposite direction. A part of the lower surface of the gate oxide layer that does not overlap with the N-type ion-doped region all overlaps with the isolation region (FOX).

At a boundary line between the ion-doped region, the isolation region and the lower surface of the gate oxide layer, since a curvature of a silicon base material in the isolation region at the boundary (also at a corner of its upper surface) is large and a surface orientation changes greatly, a structure of the subsequent gate oxide layer growing here is relatively weak, forming structural defects. As a result, the gate oxide layer here is easy to break down at a low voltage for programming.

When the gate capacitor has two ion-doped regions, the source of the selection transistor merges with one ion-doped region of the gate capacitor. The two N-type ion-doped regions horizontally extend towards each other in the active region in the substrate or the P-well, until they both overlap a part of the lower surface of the gate oxide layer, and both extend to be seamlessly bonded with an isolation region (FOX) located in the substrate or the P-well and beneath the gate oxide layer. The two N-type ion-doped regions are separated by the isolation region (FOX).

In this case, there are two boundary lines between the ion-doped regions, the isolation region, and the lower surface of the gate oxide layer. In this way, there are more defects in the gate oxide layer, and the gate oxide layer is easier to break down at a low voltage for programming.

In the case that the gate capacitor has the two ion-doped regions, the two ion-doped regions are connected via a metal line. In this way, the two ion-doped regions may operate together.

The ion-doped region of the gate capacitor and the isolation region are seamlessly bonded in the substrate, which may effectively prevent a leakage current between the gate and the substrate during programming in a breakdown mode and during reading.

Specifically, a thickness of the gate oxide layer of the gate capacitor is less than that of a gate oxide layer of the selection transistor. In this way, an operating voltage of the gate capacitor and power consumption may be reduced, and a programming speed may be improved.

The thickness of the gate oxide layer of the selection transistor is a conventional value in the industry. A ratio of the thickness of the gate oxide layer of the selection transistor to the thickness of the gate oxide layer of the gate capacitor is from 1.1:1 to 20:1, specifically from 1.2:1 to 15:1, more specifically from 1.3:1 to 10:1, further specifically from 1.4:1 to 5:1, and most specifically from 1.5:1 to 3.5:1.

The selection transistor may be a PMOS transistor or an NMOS transistor, and a type of the ion-doped region of the gate capacitor is the same as that of the selection transistor. The selection transistor is specifically the NMOS transistor, and the ion-doped region of the gate capacitor is N-type. In this case, there is a P-well in the substrate, and the selection transistor and the gate capacitor are located in the P-well.

At least one of the above-mentioned first memory cells may form an array of multiple rows by multiple columns to form a memory, also called a first type of memory. Substrates of all memory cells merge together to form a substrate of the array or memory. Every two adjacent memory cells in each row are arranged in a left-right mirror symmetry, in which two adjacent selection transistors share a drain, and two adjacent gate capacitors are not in contact with each other, selection transistors of all memory cells in each column are aligned in an up-down direction, and gates of the selection transistors are integral.

The array or memory also specifically includes a bit line in each row connected to a drain of a selection transistor of each memory cell in the row, a programming line in each row connected to a gate of a gate capacitor of each memory cell in the row, and a word line in each column connected to a gate of a selection transistor of each memory cell in the column.

In the array or memory, each memory cell may be programmed independently.

On the basis of the first memory cell, a second anti-fuse type one-time programmable (OTP) memory cell according to embodiments of the present disclosure further includes a first selection transistor and a detection transistor, which are connected in series and located in the substrate. The selection transistor in the above-mentioned first memory cell is called a second selection transistor, which is connected in series with the gate capacitor. The detection transistor and the gate capacitor share a gate.

An ion-doped region of the gate capacitor merges with a source of the second selection transistor. In a programming operation, the second selection transistor is turned on, so that a low potential is applied to the ion-doped region beneath a gate oxide layer of the gate capacitor through the second selection transistor connected in series therewith. At the same time, a high potential is applied to a gate of the gate capacitor, and the gate oxide layer of the gate capacitor breaks down under the action of a voltage difference between two sides thereof.

A drain of the detection transistor merges with a source of the first selection transistor. In a programming operation, the first selection transistor is turned on, so that a high potential is applied to the drain of the detection transistor through the first selection transistor connected in series with the detection transistor. At the same time, a high potential is applied to a source of the detection transistor, so that the detection transistor is protected from breakdown during programming in a breakdown mode. In a read operation after the programming in the breakdown mode, a read current is amplified to improve reading speed and sensitivity. A read current flows from a drain of the first selection transistor.

Three transistors in the second memory cell each include a gate, a gate oxide layer beneath the gate, and a drain and a source beneath the gate oxide layer. The gate capacitor includes a gate, a gate oxide layer beneath the gate, and an ion-doped region beneath the gate oxide layer.

Like the first memory cell mentioned above, the substrate of the second memory cell contains active regions (AA) and an isolation region (FOX), and the active regions are adjacent to the isolation region. The source and drain of the first selection transistor and the source and drain of the detection transistor are located in one active region, and the source and drain of the second selection transistor, and the ion-doped region of the gate capacitor are located in another active region. There is an isolation region between the two active regions, which are separated by the isolation region. The isolation region surrounds the three transistors and the gate capacitor.

There is specifically a well in the substrate, which may be a P-well (PW) or an N-well (NW), specifically a P-well. In a case of a well in the substrate, both the active regions and the isolation region are located in the well.

A thickness of gate oxide layers of two selection transistors is a conventional value, specifically equal.

Specifically, a thickness of the gate oxide layer of the gate capacitor is less than that of gate oxide layers of the two selection transistors. In this way, an operating voltage of the gate capacitor and power consumption may be reduced, and a programming speed may be improved. Meanwhile, in a structure according to embodiments of the present disclosure, the detection transistor also specifically has a thin gate oxide layer, thus further reducing the power consumption and improving a reading speed. More specifically, the thickness of the gate oxide layer of the gate capacitor is equal to that of the gate oxide layer of the detection transistor.

A ratio of the thickness of the gate oxide layer of the selection transistor to the thickness of the gate oxide layer of the gate capacitor is from 1.1:1 to 20:1, specifically from 1.2:1 to 15:1, more specifically from 1.3:1 to 10:1, yet more specifically from 1.4:1 to 5:1, and most specifically from 1.5:1 to 3.5:1. Similarly, a ratio of the thickness of the gate oxide layer of the selection transistor to the thickness of the gate oxide layer of the detection transistor is from 1.1:1 to 20:1, specifically from 1.2:1 to 15:1, more specifically from 1.3:1 to 10:1, yet more specifically from 1.4:1 to 5:1, and most specifically from 1.5:1 to 3.5:1.

Like the first memory cell, there are one or two ion-doped regions beneath the gate oxide layer of the gate capacitor. The ion-doped regions horizontally extend to overlap with a part of a lower surface of the gate oxide layer of the gate capacitor in the active region, and a part of the lower surface of the gate oxide layer that does not overlap with the ion-doped regions all overlaps with the isolation region (FOX) located in the substrate or the P-well and beneath the gate oxide layer. The ion-doped regions are seamlessly joined to the isolation region. This may effectively prevent a leakage current between the gate and the substrate during programming in a breakdown mode and during reading.

In the memory cell according to an embodiment of the present disclosure, a type of the first selection transistor is the same as that of the detection transistor, and a type of the second selection transistor is the same as that of the ion-doped regions of the gate capacitor. Specifically, types of the three transistors are the same, and types of the ion-doped regions of the gate capacitor are also the same as those of the source and drain of the three transistors.

More specifically, the two selection transistors and the detection transistor are NMOS transistors, and the ion-doped regions beneath the gate oxide layer of the gate capacitor are N-type doped regions. In this case, there is a P-well in the substrate, and three NMOS transistors and the gate capacitor are located in the P-well.

In the case that the two selection transistors are of the same type, the first selection transistor and the second selection transistor are connected to share a gate, so that a structure of the memory cell may be further simplified, and the operation is more convenient, and the two selection transistors may be turned on or off at the same time.

In some embodiments, the two selection transistors may not share a gate, so that before starting the programming operation, the first selection transistor may be turned on to apply a high potential to the drain of the detection transistor, and apply a high potential to the source of the detection transistor, and then the second selection transistor may be turned on to implement programming. This may better protect the detection transistor from breakdown during programming.

The one-time programmable memory cell group according to embodiments of the present disclosure includes four above-mentioned second memory cells, which are arranged in a centrosymmetric array of 2 rows by 2 columns, and substrates of all memory cells merge together.

Two memory cells in each row in the group are arranged in a left-right mirror symmetry, in which two detection transistors of two memory cells share a source, and two gate capacitors are left-right adjacent to each other in the middle of the row without being contacted with each other; and two selection transistors in one memory cell are located at one side of the group, while two selection transistors in another memory cell are located at the other side of the group. Two memory cells in each column are arranged in an up-down mirror symmetry, four selection transistors in each column are aligned in an up-down direction, and gates of two second selection transistors or two first selection transistors adjacent to each other and aligned in the up-down direction in the two memory cells are integrally connected in the up-down direction.

In the case that the first and second selection transistors in each memory cell share a gate, gates of the four selection transistors in each column are connected to form a shared gate.

Specifically, the four memory cells in the memory cell group have a same structure, composition and ingredient.

The memory cell group according to an embodiment of the present disclosure specifically further includes a common line in each row connected to a shared source of two detection transistors in the row, a bit line in each row connected to a drain of a first selection transistor of each memory cell in the row, a programming bottom line in each row connected to a drain of a second selection transistor of each memory cell in the row, a programming line in each row connected to a shared gate of the gate capacitor and the detection transistor of each memory cell in the row, and two word lines in each column respectively connected to two gates of first and second selection transistors in each memory cell in the column, or one word line in each column connected to a shared gate of first and second selection transistors in each memory cell in the column.

The second one-time programmable memory according to an embodiment of the present disclosure includes at least one of the above-mentioned memory cell groups to form an array, and an arrangement manner of groups in the array is the same, and substrates of the memory cells of groups merge together to form a substrate of the array.

In the array, in two adjacent groups in each row, two first selection transistors adjacent to each other in a left-right direction share a first drain, and two second selection transistors adjacent to each other in the left-right direction share a second drain; in two adjacent groups in each column, gates of two adjacent second selection transistors or two adjacent first selection transistors aligned in an up-down direction are connected; a common line, a bit line, a programming bottom line, and a programming line of each group in each row are connected to form a common line, a bit line, a programming bottom line, and a programming line of the row, respectively; and one or two word lines of groups in each column are respectively connected or concatenated to form one or two word lines of the column. It is to be noted that in the two adjacent groups in each row, a drain shared by the two first selection transistors adjacent to each other in the left-right direction may be called the first drain, and a drain shared by the two second selection transistors adjacent to each other in the left-right direction may be called the second drain.

In the case that the first and second selection transistors in each memory cell in each group share a gate, gates of all selection transistors in each column are connected to form a shared gate.

Specifically, in the array, a structure, a composition and an ingredient of each group are all identical.

In the memory cell group, and array and memory thereof according to embodiments of the present disclosure, each second memory cell may be programmed independently.

The two one-time programmable memory cells, and memories thereof according to embodiments of the present disclosure may be prepared by conventional mature processes in the industry, such as standard processes of 130 nm, 110 nm, and 90 nm, or by advanced processes, such as standard processes from 55 nm to 7 nm.

In the above-mentioned preparation processes, a position and a pattern size of the isolation region in the substrate or a well within the substrate are formed by a common way in the industry. For example, a shape and a size of the isolation region, including a shape and a size of the isolation region extending beneath the gate oxide layer of the gate capacitor, are designed and defined in a layout, and are generated by photolithography and dry etching at a required position through its corresponding lithography plate.

One or two ion-doped regions of the gate capacitor overlap with a part of the lower surface of the gate oxide layer, respectively, and are seamlessly adjacent to the isolation regions in the substrate and/or the well within the substrate, which is formed by a common expansion step of the doped regions in the industry. Specifically, in the above-mentioned standard processes, after the ion-doped regions are formed on one or two sides of the gate of the gate capacitor, the ion-doped regions are further expanded to a position of the isolation region, and are seamlessly bonded with the isolation region.

In the gate capacitor, the metal line (ML) connecting the two ion-doped regions is also formed in a common way in the industry. Specifically, in the above-mentioned processes, after two ion-doped regions of the gate capacitor are formed, two contact points are formed on the surfaces of the two ion-doped regions, respectively, a metal line is formed on the contact points, and two ends of the metal line are connected with the two contact points, respectively.

In the case that the thickness of the gate oxide layer of the selection transistor is different from the thickness of the gate oxide layer of the gate capacitor, in the preparation process, the gate oxide layers with different thickness are also formed by common growth methods in the industry. For example, by thermal oxidation, a layer of gate oxide is grown to a thickness of 1 in a region where the gate oxide layer of the selection transistor and the gate oxide layer of the gate capacitor are to be generated, and then the gate oxide layer 1 generated in the region where the gate oxide layer of the gate capacitor is to be generated is completely removed by wet etching. Then, a new layer of gate oxide is simultaneously formed in the gate oxide regions of the selection transistor and the gate capacitor by thermal oxidation again to achieve a desired thickness of the gate capacitor. The thickness 1 is a difference between the thickness of the gate oxide layer of the selection transistor and the thickness of the gate oxide layer of the gate capacitor. For a detection transistor with a thin gate oxide layer, a growth mode of its gate oxide layer is the same as that of the above-mentioned gate capacitor.

Two memory cells, and group structures and array structures thereof according to embodiments of the present disclosure are described in combination with the accompanying drawings below. Obviously, specific embodiments described in the accompanying drawings are only some of embodiments of the present disclosure, but not all of the embodiments. Components in the embodiments of the present disclosure generally described and illustrated in the accompanying drawings herein may be arranged and designed in a variety of different configurations. Therefore, the following detailed description of the embodiments of the present disclosure provided in the accompanying drawings is not intended to limit the scope of the present disclosure, but is merely representative of selected embodiments of the present disclosure. Based on the embodiment of the present disclosure, all other embodiments obtained by those skilled in the art without creative labor shall fall within the protection scope of the present disclosure.

Figure 2A:
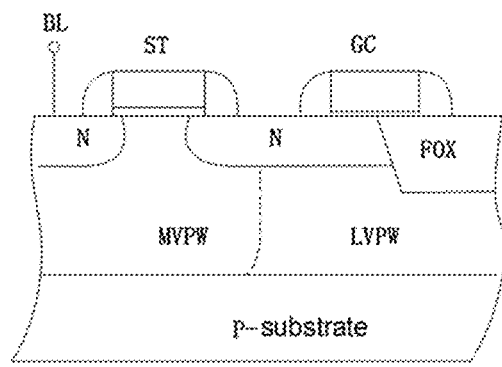
FIGS. 2A-2C show cross-sectional views of the memory cell shown in FIG. 1 taken along section lines a1-a1, b1-b1 and c1-c1, respectively.
Figures 2B, 2C:
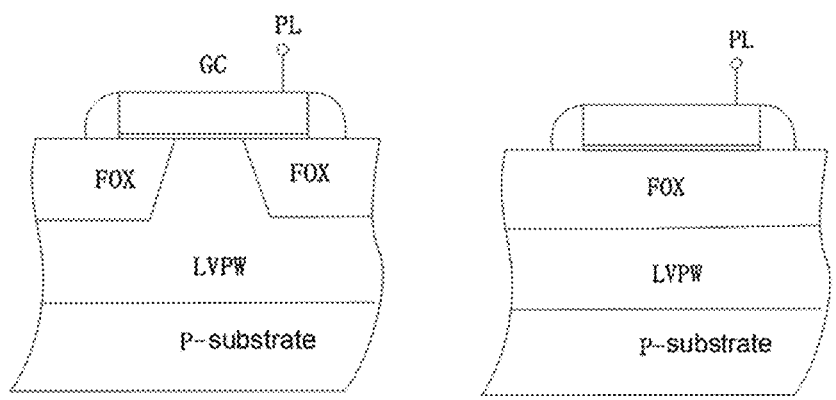

FIG. 1 shows a top view of a first memory cell according to an embodiment of the present disclosure. FIGS. 2A-2C show cross-sectional views of the memory cell taken along section lines a1-a1, b1-b1 and c1-c1, respectively.

The memory cell includes a selection transistor (ST), and a gate capacitor (GC) connected in series with the ST.

The selection transistor (ST) is an NMOS transistor, including a gate, a gate oxide layer beneath the gate, and an N-type drain and an N-type source beneath the gate oxide layer. The gate capacitor (GC) includes a gate, a gate oxide layer beneath the gate, and an N-type ion-doped region beneath the gate oxide layer. The transistor and the gate capacitor are located in a medium voltage P-well (MVPW) and a low voltage P-well (LVPW) in a P-type substrate, respectively.

The gate capacitor (GC) and the selection transistor (ST) are devices fabricated on a same 110 nm standard process platform, in which the gate capacitor (GC) is a 1.5V device and the selection transistor (ST) is a 5V device. The gate capacitor (GC) is a low voltage device with a thin gate oxide layer, which is located in the low voltage P-well (LVPW). The selection transistor (ST) is a medium voltage device with a thick gate oxide layer, which is located in the medium voltage P-well (MVPW).

There are an active region (AA) and an isolation region (FOX) in the P-well. AA in FIG. 1 and FIGS. 2A-2C represents an active region, and a source and a drain of the selection transistor and the ion-doped region of the gate capacitor are both located in the active region. The FOX is a shallow trench isolation region filled with thick field oxide. Both the selection transistor (ST) and the gate capacitor (GC) are surrounded by the shallow trench isolation region.

The source of the selection transistor merges with the N-type ion-doped region of the gate capacitor. The drain of the selection transistor is connected to a bit line (BL), the gate of the selection transistor is connected to a word line (WL), and the gate of the gate capacitor is connected to a programming line (PL).

A thickness of the gate oxide layer of the gate capacitor is less than that of a gate oxide layer of the selection transistor, and the thickness of the gate oxide layer of the selection transistor is a conventional value. A ratio of the thickness of the gate oxide layer of the selection transistor to the thickness of the gate oxide layer of the gate capacitor is 3.5:1.

The N-type ion-doped region of the gate capacitor horizontally extends to a side of the gate capacitor that does not contain the N-type ion-doped region within the active region in the P-well until it overlaps with a part of a lower surface of the gate oxide layer of the gate capacitor. The isolation region (FOX) horizontally extends beneath the gate oxide layer of the gate capacitor from a side of the gate capacitor that does not contain the N-type ion-doped region in the substrate or the P-well on the substrate, and overlaps with respectively a part of the lower surface of the gate oxide layer of the gate capacitor until it is seamlessly joined with the N-type ion-doped region extending horizontally in an opposite direction. A part of the lower surface of the gate oxide layer that does not overlap with the N-type ion-doped region all overlaps with the isolation region (FOX).

Figure 3:
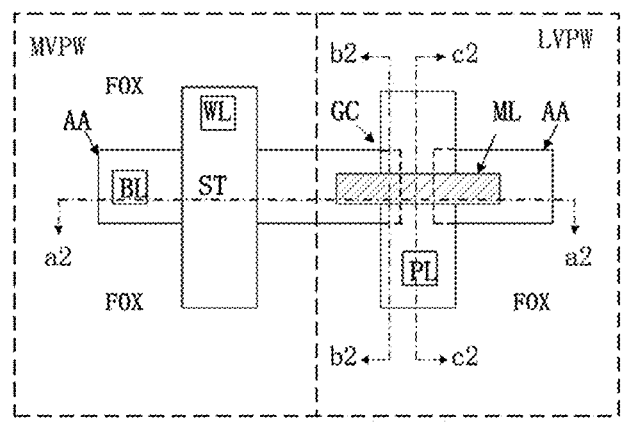
FIG. 3 shows a top view of a first memory cell according to another embodiment of the present disclosure.
Figure 4A:
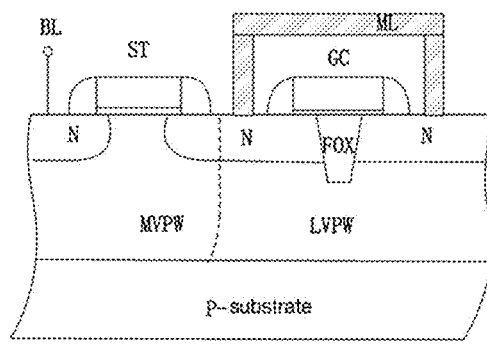
FIGS. 4A-4C show cross-sectional views of the memory cell shown in FIG. 2 taken along section lines a2-a2, b2-b2 and c2-c2, respectively.
Figures 4B, 4C:
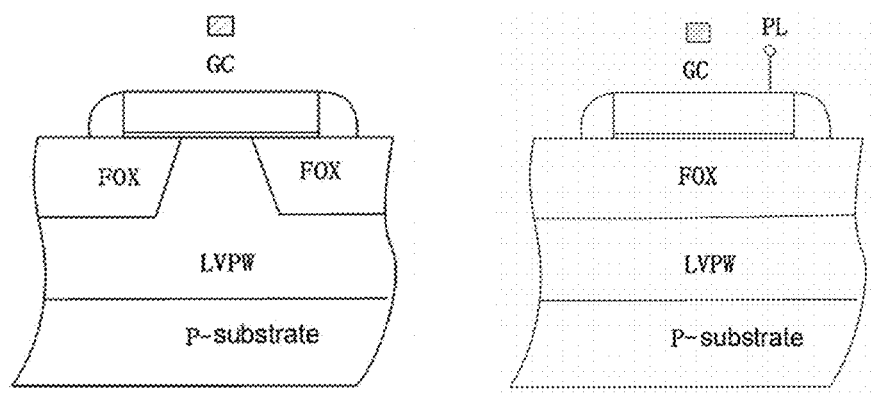

FIG. 3 shows a top view of a first memory cell according to another embodiment of the present disclosure. FIGS. 4A-4C show cross-sectional views of the memory cell taken along section lines a2-a2, b2-b2 and c2-c2, respectively.

The structure of the memory cell is similar to that of FIG. 1, except that there are two N-type ion-doped regions beneath the gate oxide layer of the gate capacitor (GC). The two N-type ion-doped regions horizontally extend towards each other in the active region in the P-well until they both overlap parts of the lower surface of the gate oxide layer, and both extend to be seamlessly bonded with an isolation region (FOX) located in the P-well and beneath the gate oxide layer. The two N-type ion-doped regions are separated by the isolation region (FOX), but are connected via a metal line (ML).

Figure 5:
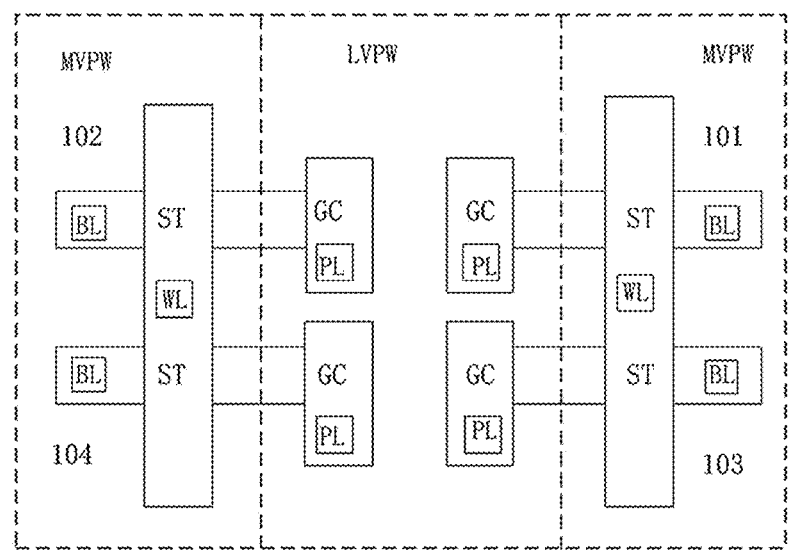
FIG. 5 shows a top view of a 2×2 array of the first memory cell shown in FIG. 1.
Figure 6:
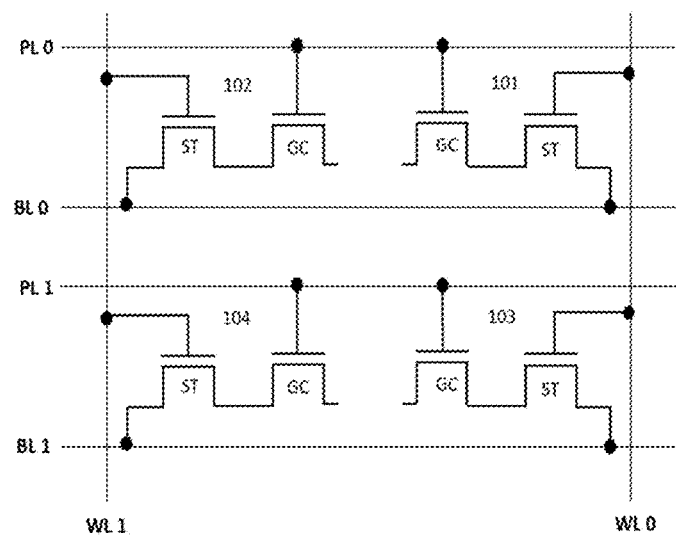
FIG. 6 shows a circuit diagram of the array shown in FIG. 5.

FIG. 5 shows a top view of a 2×2 array composed of four memory cells shown in FIG. 1. FIG. 6 is a circuit diagram of the array.

The four memory cells in the array are located in the same P-type substrate, and are arranged in a left-right mirror symmetry array of 2 rows by 2 columns. The four memory cells in the array are identical, being all identical in a structure, a composition, and an ingredient, but different in an arrangement position and direction.

Two memory cells 101 and 102 in a first row are arranged in a left-right mirror symmetry. Two gate capacitors (GCs) are left-right adjacent to each other in the middle of the row without being contacted with each other. Two selection transistors are located at two sides of the row.

Two memory cells 103 and 104 in a second row are arranged in a same manner as the two memory cells 101 and 102 in the first row, respectively, but are arranged in an up-down mirror symmetry to the two memory cells 101 and 102 in the first row, respectively.

Two memory cells 101 and 103 in a first column are arranged in an up-down mirror symmetry, and gates of two selection transistors (STs) adjacent to each other in the up-down direction in the two memory cells are connected to form a shared gate.

Two memory cells 102 and 104 in a second column are arranged in a same manner as the memory cells 101 and 103 in the first column, respectively, but are arranged in a left-right mirror symmetry to the memory cells 101 and 103 in the first column, respectively.

Two adjacent low voltage P-wells (LVPWs) of two memory cells in each row merge together.

Two medium voltage P-wells (MVPWs) and two low voltage P-wells (LVPW) of two memory cells in each column merge together, respectively.

In the array, there is a bit line (BL) and a programming line (PL) in each row, which are connected to a drain of the selection transistor (ST) of each memory cell in the row and a gate of the gate capacitor (GC), respectively. There is a word line (WL) in each column, which is connected to a shared gate of selection transistors in the memory cells in the column.

FIG. 7 shows bias signals connected to the array shown in FIGS. 5-6 during different operations.

Each memory cell in the above-mentioned array may be programmed independently. During programming, a high voltage difference is applied between a gate of a gate capacitor of a programming cell and the N-doped region beneath the gate oxide layer, resulting in the breakdown of the gate oxide layer and the formation of a conductive path from the N-doped region to the gate.

For example, a memory cell 101 in a group is designated as a programming cell. The memory cell 101 is programmed by driving potentials of the word line (WL) and the programming line (PL) to 5.0V and 4.0V, respectively, a potential of the bit line (BL) is 0V, and a potential of the P-well (the LVPW and the MVPW) is 0V. A high potential of the word line (WL) makes the selection transistor (ST) quickly turn on, so that a potential of 0V is applied to the N-type ion-doped region of the gate capacitor (GC), which is equal to that of the bit line (BL) connected to the drain of the selection transistor. A high potential of 4.0V is applied to the gate of the gate capacitor through the programming line (PL), and a potential of the N-type ion-doped region beneath the gate of the gate capacitor is 0V, thus forming a high voltage difference on two sides of the gate oxide layer, which leads to the breakdown of the gate oxide layer for programming.

A potential of a word line (WL) of the memory cell 102 is 0V, and the other driving potentials are the same as those of the memory cell 101. The selection transistor cannot be turned on, so the N-type ion-doped region of the gate capacitor (GC) is in a floating state. Although a potential of the gate (the programming line (PL)) of the gate capacitor is 4.0V, there is no voltage difference between the two sides of the gate oxide layer that leads to breakdown, so the gate oxide layer cannot be broken down for programming.

A potential of a programming line (PL) of the memory cell 103 is 0V, and the other driving potentials are the same as those of the memory cell 101. The potential 0V of the gate of the gate capacitor is equal to the potential 0V of the underlying N-type ion-doped region, so the gate oxide layer cannot be broken down.

Potentials of a word line (WL), a bit line (BL), and a programming line (PL) of the memory cell 104 are all 0V. The selection transistor cannot be turned on, and a potential of the gate of the gate capacitor is 0V, so the gate oxide layer cannot be broken down.

In a reading operation, the selection transistor (ST) needs to be turned on, and there is a voltage difference between the source (which is also the N-type ion-doped region of the gate capacitor) and the drain of the selection transistor, so that a reading current is generated from the source to the drain (BL) of the selection transistor.

The memory cell 101 is designated as a reading cell. A potential of the word line (WL) and the bit line (BL) is driven to be 1.5V, and a potential of the programming line (PL) and the P-well (the LVPW and the MVPW) is 0V. The 1.5V potential of the word line (WL) turns on the selection transistor (ST). A conductive path is formed due to the breakdown of the gate oxide layer of the gate capacitor, and the potential of the N-doped region beneath the gate oxide layer of the gate capacitor is equal to the potential of the gate. Thus, the potential 0V of the source of the selection transistor (which is also the N-type ion-doped region of the gate capacitor) is the same as that of the programming line (PL). Since there is a voltage difference between the potential 0V of the source and the potential 1.5V of the drain of the selection transistor (ST), a reading current is generated from the source to the drain of the selection transistor (ST).

A potential of the word line (WL) of the memory cell 102 is 0V, and the other driving potentials are the same as those of the memory cell 101. The selection transistor cannot be turned on, and the gate oxide layer of the gate capacitor has not been broken down for programming, so a conductive channel cannot be formed between the source and the drain of the selection transistor. There is no voltage difference between the source and the drain of the selection transistor, so that a reading current cannot be generated.

A potential of a bit line (BL) of the memory cell 103 is 0V, and the other driving potentials are the same as those of the memory cell 101. The potential of the word line (WL) is 1.5V, and the selection transistor (ST) is turned on. Since the gate oxide layer of the gate capacitor is not broken down for programming, a potential cannot be applied to the N-type ion-doped region beneath the gate oxide layer of the gate capacitor from the programming line (PL). There is no voltage difference between the source and the drain of the selection transistor, so that a reading current cannot be generated.

Associated driving potentials of the memory cell 104 are all 0V. The selection transistor cannot be turned on, and a reading current cannot be generated from the source to the drain of the selection transistor.

The memory cell shown in FIG. 3 may also be arranged in a 2×2 array as shown in FIG. 5, and an arrangement, a structure and an operation mode of the array are the same as those of the memory cells shown in FIG. 1. A bias signal during the operation of the memory cell shown in FIG. 3 is similar to that shown in FIG. 7, except that a potential value of the programming line (PL) of the designated programming cell of the memory cell shown in FIG. 3 is about 0.2V lower than that of the memory cell shown in FIG. 1 as illustrated in FIG. 5. Since the metal line (ML) connects the two N-type ion-doped regions of the gate capacitor, the two ion-doped regions have a same potential value during programming and participate in the programming together.

FIG. 8 shows a top view of an array formed by more memory cells shown in FIG. 1. An arrangement, a structure and a connecting line of the memory cells in the array are the same as those shown in FIG. 5. Further, two selection transistors (STs) adjacent to each other in a left-right direction of two adjacent memory cells in each row share a drain, and two low voltage P-wells (LVPWs) of two adjacent memory cells left-right adjacent to each other in each row merge together. The gates of the selection transistors (STs) of all memory cells in each column are connected to form a shared gate, and the medium voltage P-wells (MVPWs) and the low voltage P-wells (LVPWs) of all memory cells in each column merge together, respectively.

FIG. 9 shows a top view of a second memory cell according to an embodiment of the present disclosure. FIGS. 10A-10E show cross-sectional views of the memory cell taken along section lines a3-a3, b3-b3, c3-c3, d3-d3, and e3-e3, respectively.

The memory cell includes a first selection transistor (S1), a detection transistor (T1) connected in series with the S1, a second selection transistor (S2), and a gate capacitor (C1) connected in series with the S2. The detection transistor (T1) and the gate capacitor (C1) share a gate, and two selection transistors S1 and S2 share a gate.

The second selection transistor (S2) and the gate capacitor (C1) are the same as the selection transistor (ST) and the gate capacitor (GC) in the memory cell shown in FIG. 1, respectively. They have a same composition, arrangement, structure and connecting line as the selection transistor (ST) and the gate capacitor (GC) in the memory cell shown in FIG. 1. The only difference is that the drain of the second selection transistor is connected to a programming bottom line (PS) instead of the bit line (BL).

S1, S2, and T1 are of the same type and are all NMOS transistors, and each transistor includes a gate, a gate oxide layer beneath the gate, and an N-type drain and an N-type source beneath the gate oxide layer. The gate capacitor (C1) includes a gate, a gate oxide layer beneath the gate, and an N-type ion-doped region beneath the gate oxide layer.

Two selection transistors are located in a medium voltage P-type well (MVPW) in a P-type substrate, and the detection transistor and the gate capacitor are located in a low voltage P-well (LVPW) in the P-type substrate.

Thicknesses of gate oxide layers in the two selection transistors S1 and S2 are equal, and thicknesses of gate oxide layers in T1 and C1 are equal. The thicknesses of the gate oxide layers of the two selection transistors are conventional values, and the thicknesses of the gate oxide layers of T1 and C1 are less than those of the gate oxide layers of the selection transistors. A ratio of the thickness of the gate oxide layers of the selection transistors to the thickness of the gate oxide layer of the detection transistor (T1) (or the gate capacitor (C1)) is 3.5:1.

The detection transistor (T1), the gate capacitor (C1), and selection transistors S1 and S2 are devices fabricated on a same 110 nm standard process platform. The detection transistor (T1) and the gate capacitor (C1) are 1.5V devices, and the selection transistors S1 and S2 are 5V devices. The detection transistor (T1) and the gate capacitor (C1) are low voltage devices with thin gate oxide layers, which are located in the low voltage P-well (LVPW). The two selection transistors S1 and S2 are medium voltage devices with thick gate oxide layers, which are located in the medium voltage P-well (MVPW).

There are an active region (AA) and an isolation region (FOX) in the P-well. AA in FIG. 9 and FIGS. 10A-10E represents an active region, and both a source and a drain of the transistor and an ion-doped region of the gate capacitor are located in the active region. The FOX is a shallow trench isolation region filled with thick field oxide. Three transistors (STs) and the gate capacitor (GC) are all surrounded by the shallow trench isolation region.

A drain of the first selection transistor (S1) is connected to a bit line (BL), a source of the first selection transistor (S1) merges with a drain of the detection transistor (T1), and a source of the detection transistor (T1) is connected to a common line (COM).

Figure 10A:
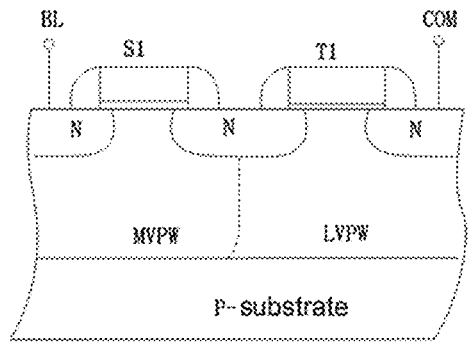
FIGS. 10A-10E show cross-sectional views of the memory cell shown in FIG. 9 taken along section lines a3-a3, b3-b3, c3-c3, d3-d3, and e3-e3, respectively.
Figure 10B:
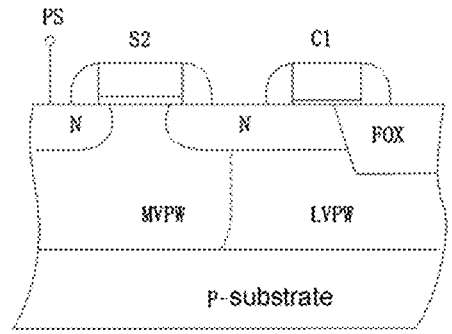
Figure 10C:
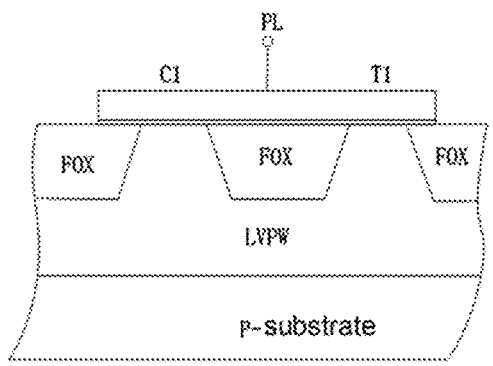
Figure 10D:
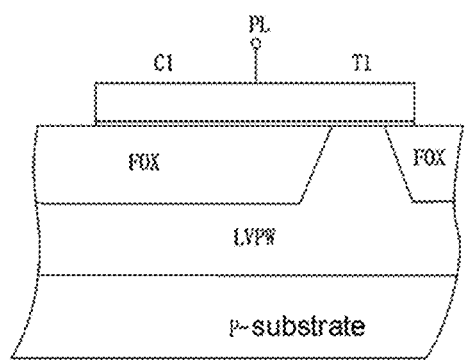
Figure 10E:
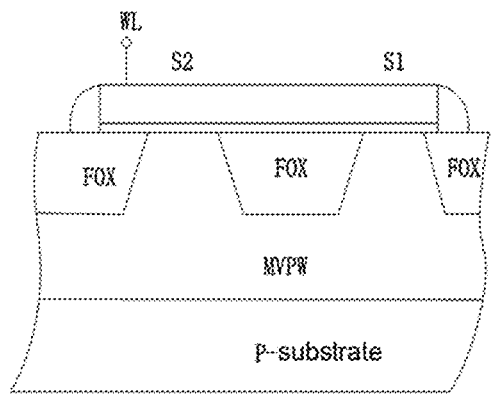

A drain of the second selection transistor (S2) is connected to a programming bottom line (PS), and a source of the second selection transistor (S2) is connected to an N-doped region of the gate capacitor (C1). The N-type doped region of the gate capacitor (C1) horizontally extends to overlap with a part of a lower surface of the gate oxide layer of the gate capacitor (C1), and a part of the lower surface of the gate oxide layer that does not overlap with the N-type ion-doped region all overlaps with the isolation region (FOX) horizontally extending beneath the gate oxide layer from a side of the gate capacitor in the P-well that does not include the N-doped region. The N-type ion-doped region and the FOX isolation region are seamlessly joined in the P-well, as shown in FIG. 10B.

A shared gate of the two selection transistors is connected to a word line (WL), and a shared gate of the detection transistor and the gate capacitor is connected to a programming line (PL). There is only one word line (WL) in the memory cell.

Figure 11:
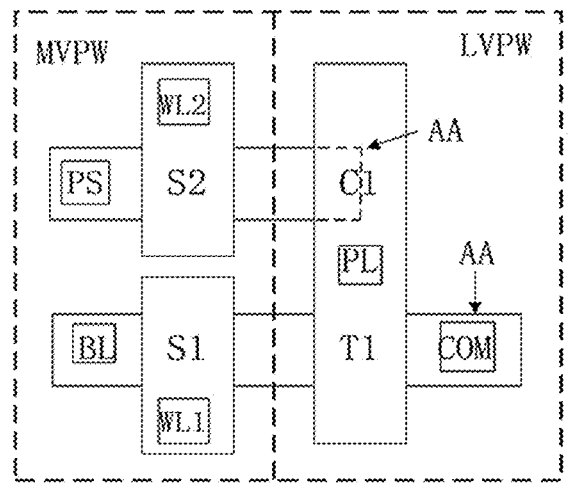
FIG. 11 shows a top view of a second memory cell according to another embodiment of the present disclosure.

The gates of the two selection transistors S1 and S2 may not be shared, as shown in FIG. 11. In this case, the gate of the first selection transistor is connected to a word line 1 (WL1), and the gate of the second selection transistor is connected to a word line 2 (WL2).

Figure 12:
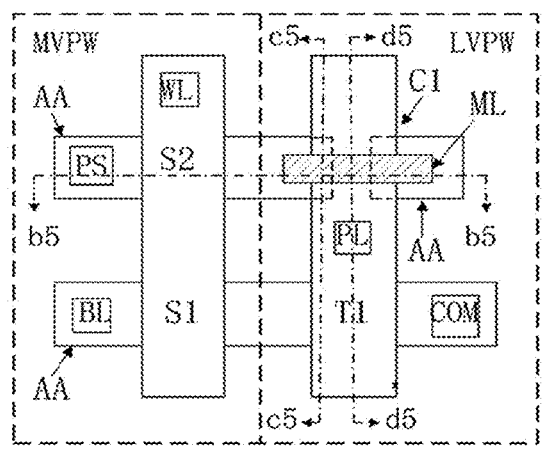
FIG. 12 shows a top view of a second memory cell according to yet another embodiment of the present disclosure.
Figures 13A, 13B:
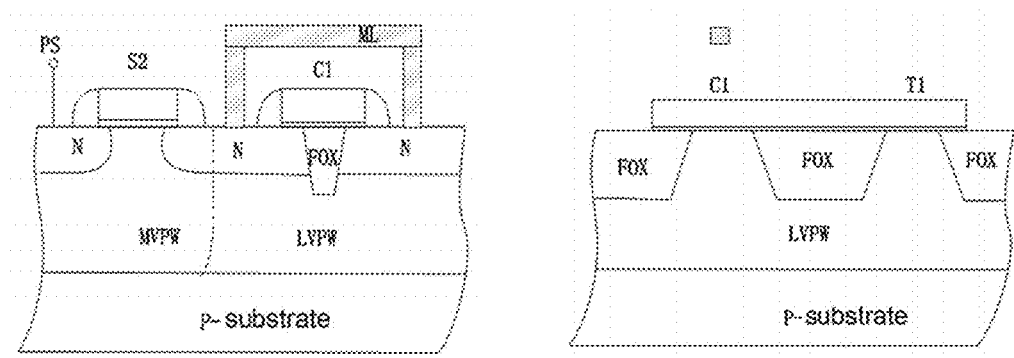
FIGS. 13A-13C show cross-sectional views of the memory cell shown in FIG. 12 taken along section lines b5-b5, c5-c5, and d5-d5, respectively.
Figure 13C:
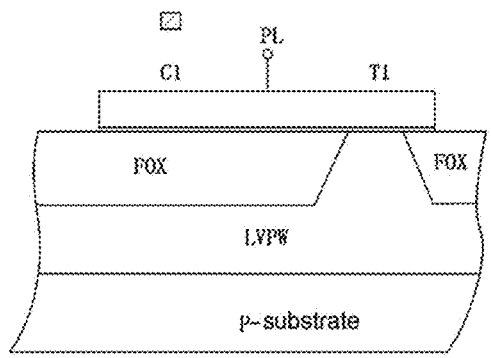

FIG. 12 shows a top view of a second memory cell according to another embodiment of the present disclosure. FIGS. 13A-13C show cross-sectional views of the memory cell taken along section lines b5-b5, c5-c5, and d5-d5, respectively.

A structure of the memory cell is similar to that in FIG. 9, except that there are two N-type ion-doped regions beneath the gate oxide layer of the gate capacitor (GC). The two N-type ion-doped regions horizontally extend toward each other in the active region in the P-well until they both overlap with a part of the lower surface of the gate oxide layer, respectively, and both extend to be seamlessly bonded with an isolation region (FOX) located in the P-well and beneath the gate oxide layer. The two N-type ion-doped regions are separated by the isolation region (FOX), but are connected via a metal line (ML).

Figure 14:
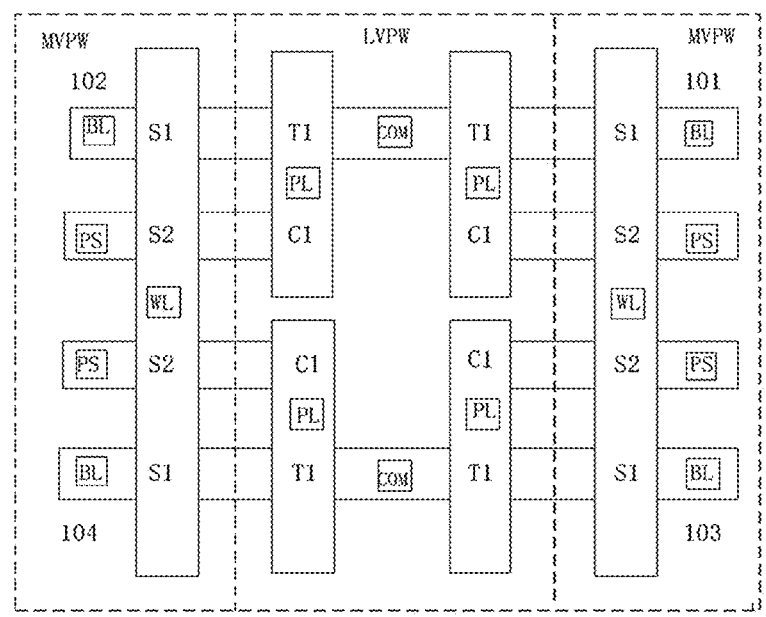
FIG. 14 shows a top view of a 2×2 array of the second memory cells shown in FIG. 9.
Figures 15, 16:
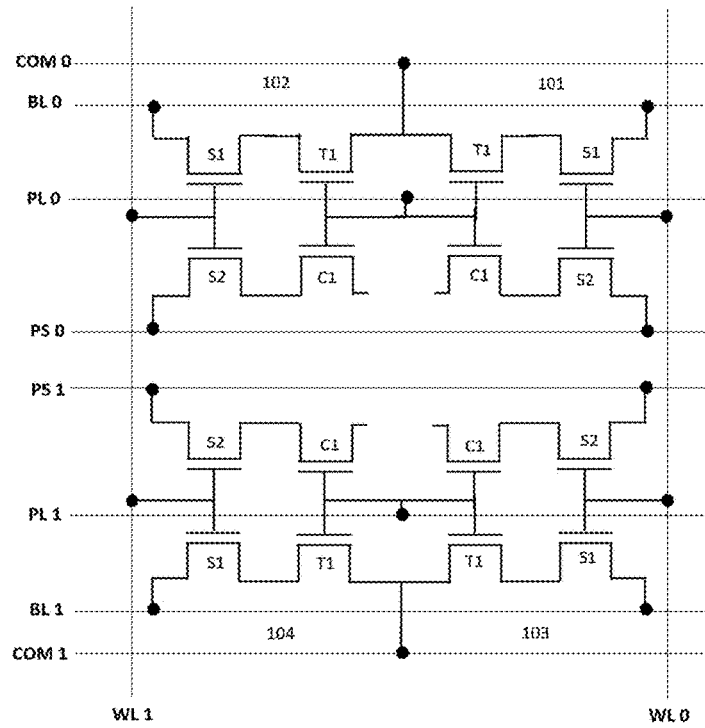
FIG. 15 shows a circuit diagram of the array shown in FIG. 14.
FIG. 16 shows bias signals connected to the array shown in FIGS. 14-15 during different operations.

FIG. 14 shows a top view of a group array composed of four memory cells shown in FIG. 9. FIG. 15 is a circuit diagram of the array.

The four memory cells in the group array are located in the same P-type substrate, and are arranged in a centrosymmetric array of 2 rows by 2 columns. The four memory cells in the group are identical, being all identical in a structure, a composition, and an ingredient, but different in an arrangement position and direction.

Two memory cells 101 and 102 in a first row are arranged in a left-right mirror symmetry, and two detection transistors (T1s) of the two memory cells are adjacent to each other in a left-right direction, share a source and are connected to a common line (COM0). The two gate capacitors (C1s) are left-right adjacent to each other in the middle of the row without being contacted with each other. The two selection transistors in the memory cell 101 are located at a right side of the group, and the two selection transistors in the memory cell 102 are located at a left side of the group.

Two memory cells 103 and 104 in a second row are arranged in a same manner as the two memory cells 101 and 102 in the first row, respectively, but are arranged in an up-down mirror symmetry to the two memory cells 101 and 102 in the first row, respectively.

Two memory cells 101 and 103 in a first column are arranged in an up-down mirror symmetry, and gates of two second selection transistors (S2) adjacent to each other in the up-down direction in the two memory cells are connected. Since the first and second selection transistors in each memory cell share a gate, four selection transistors in the first column share a gate and are all connected to a word line (WL0).

Two memory cells 102 and 104 in a second column are arranged in a same manner as the two memory cells 101 and 103 in the first column, respectively, but are arranged in a left-right mirror symmetry to the two memory cells 101 and 103 in the first column, respectively.

Two adjacent low voltage P-wells (LVPWs) of two memory cells in each row merge together.

Two medium voltage P-wells (MVPWs) and two low voltage P-wells (LVPWs) of two memory cells in each column merge together, respectively.

In the array, there is a common line (COM) in each row connected to a shared source of two adjacent detection transistors in the row, a bit line (BL) in each row connected to a drain of a first selection transistor (S1) of each memory cell in the row, a programming bottom line (PS) in each row connected to a drain of a second selection transistor (S2) of each memory cell in the row, a programming line (PL) in each row connected to a shared gate of the gate capacitor and the detection transistor of each memory cell in the row, and a word line (WL) in each column connected to a shared gate of the selection transistors of each memory cell in the column.

FIG. 16 shows bias signals connected to the memory cell array shown in FIG. 14 during different operations.

Each memory cell in the group may be programmed independently. During programming, a high voltage difference is applied between the gate of the gate capacitor of the programming cell and the N-doped region beneath the gate oxide layer, which leads to the breakdown of the gate oxide layer and the formation of a conductive path from the N-doped region to the gate.

For example, the memory cell 101 in a group is designated as the programming cell. The memory cell 101 is programmed by driving potentials of the word line (WL) and the programming line (PL) to 5.0V and 4.0V, potentials of the bit line (BL) and the common line (COM) to 1.5V, and potentials of the PS and P well to 0V, respectively. The high potential of the word line (WL) makes the selection transistors S1 and S2 turn on quickly, so that a potential of 0V is applied to the N-type ion-doped region of the gate capacitor (C1), which is equal to a potential of the programming bottom line (PS). At the same time, a potential is applied to the drain of the detection transistor (T1), which is equal to that of the drain of the selection transistor (S1). That is, the potential of the bit line (BL) is 1.5V. A high potential of 4.0V is applied to the gate of the gate capacitor through the programming line (PL), and the potential of the N-type ion-doped region beneath the gate of the gate capacitor is 0V, thus forming a high voltage difference on two sides of the gate oxide layer, resulting in breakdown of the gate oxide layer for programming. Although a high potential of 4.0V is also applied to the gate of the detection transistor (T1) through the programming line (PL), the potential of the drain and source (COM) of the detection transistor (T1) is 1.5V, and a voltage difference between two sides of the gate oxide layer is not enough to cause breakdown.

A potential of the word line (WL) of the memory cell 102 is 0V, and the other driving potentials are the same as those of the memory cell 101. The two selection transistors cannot be turned on, so the N-type ion-doped region of the gate capacitor (C1) is in a floating state. Although the potential of the gate (the programming line (PL)) of the gate capacitor is 4.0V, no voltage difference exists between the two sides of the gate oxide layer that leads to breakdown, so the gate oxide layer cannot be broken down for programming.

A potential of the programming line (PL) of the memory cell 103 is 0V, and the other driving potentials are the same as those of the memory cell 101. The potential 0V of the gate of the gate capacitor is equal to the potential 0V of the N-type ion-doped region beneath the gate of the gate capacitor, and thus the gate oxide layer cannot be broken down.

Potentials of the word line (WL), the programming line (PL), and the programming bottom line (PS) of the memory cell 104 are all 0 V. The selection transistor cannot be turned on, and the potential of the gate of the gate capacitor is 0V, so the gate oxide layer cannot be broken down.

In the reading operation, both the detection transistor (T1) and the selection transistor (S1) connected in series need to be turned on, and there is a voltage difference between the source (COM) and the drain of the detection transistor (T1), so a reading current is generated from the source (COM) of the detection transistor (T1) to the drain (BL) of the selection transistor (S1).

The memory cell 101 is designated as a reading cell. The potential to drive the word line (WL) and the bit line (BL) is 1.5V, the potential of the programming bottom line (PS) is 1V, the potential of the common line (COM) and the P-well is 0V, and the programming line (PL) is in a floating state. The potential 1.5V of the word line (WL) turns on the selection transistors S1 and S2, so that the potential 1V of the N-doped region of the gate capacitor (C1) is close to or equal to that of the programming bottom line (PS), and a potential of the drain of the detection transistor (T1) is close to or equal to that of the drain of the selection transistor (S1). Since the gate oxide layer of the gate capacitor breaks down, a conductive path is formed, and the potential of the gate of the gate capacitor is equal to that of the N-doped region beneath the gate. The gate potential is greater than a threshold of the thin gate oxide detection transistor (T1), causing the detection transistor (T1) to turn on. Since there is a voltage difference between the potential 0V of the source (COM) and the potential 1.5V of the drain of the detection transistor (T1), a reading current is generated from the source (COM) to the drain of the detection transistor (T1), and to the drain (BL) of the selection transistor (S1).

A potential of the word line (WL) of the memory cell 102 is 0V, and the other driving potentials are the same as those of the memory cell 101. The selection transistor cannot be turned on, and the gate oxide layer of the gate capacitor (C1) has not been broken down for programming, and the programming line (PL) is in a floating state, so a potential cannot be applied to the gate of the gate capacitor. Therefore, the detection transistor (T1) cannot be turned on. There is no voltage difference between the source and the drain of the detection transistor (T1), so a reading current cannot be generated.

A potential of the bit line (BL) and the programming bottom line (PS) of the memory cell 103 is 0V, and the other driving potentials are the same as those of the memory cell 101. Since the potential of the word line (WL) is 1.5V, the selection transistors S1 and S2 are turned on, and a potential of 0V is applied to the N-type doped region beneath the gate capacitor (C1). Since the gate oxide layer of the gate capacitor is not broken down for programming, and the programming line (PL) is floating, a potential cannot be applied to the gate, so the detection transistor (T1) cannot be turned on and a reading current cannot be generated.

Associated driving potentials of the memory cell 104 are all 0V, and the programming line (PL) is floating. Neither the two selection transistors nor the detection transistor (T1) may be turned on, and a reading current cannot be generated from the source (COM) to the drain (BL) of the detection transistor (T1).

Figure 18:
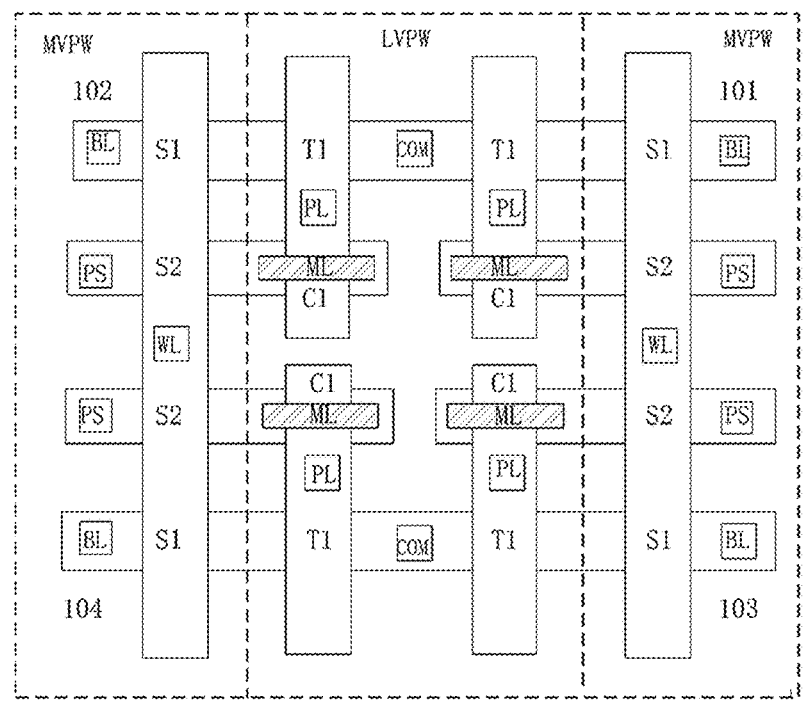
FIG. 18 shows a top view of a 2×2 array of the second memory cells shown in FIG. 12.

Like the memory cell shown in FIG. 9, the memory cells shown in FIG. 11 or FIG. 12 may also be arranged in a 2×2 array as shown in FIG. 14, and an array arrangement, array structure and operation mode are the same as those of the memory cells shown in FIG. 9. The bias signal during operation is similar to that shown in FIG. 16, but differences are as follows. In the memory cell array shown in FIG. 11, there are two bit lines in each column, which are connected to the first selection transistor and the second selection transistor of each memory cell in the column, respectively, and potential values of the two bit lines in each operation process are the same, which is also the same as that of the bit line (BL) in FIG. 16. When the memory cell array shown in FIG. 12 is programmed, a potential value of the programming line (PL) of the designated programming cell of the memory cell array shown in FIG. 12 is about 0.2V lower than that of the PL of the memory cell shown in FIG. 9 as illustrated in FIG. 16. In the memory cell array shown in FIG. 12, since the metal line (ML) in the memory cell is connected to two N-type ion-doped regions of the gate capacitor, the two ion-doped regions have a same potential value during programming and participate in the programming together. FIG. 18 is a top view of a 2×2 array composed of four memory cells shown in FIG. 12.

Figure 17:
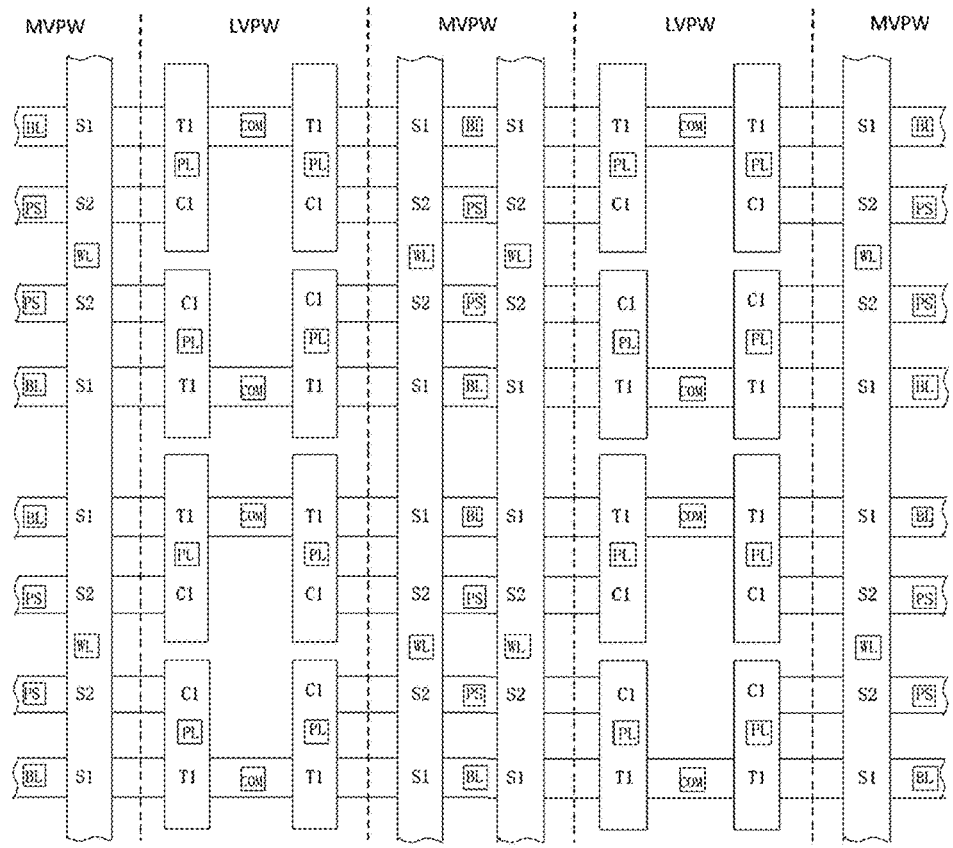
FIG. 17 shows a top view of an array of multiple rows by multiple columns of the memory cells shown in FIG. 9.

FIG. 17 shows a top view of an array formed by a plurality of memory cell groups shown in FIG. 14. An arrangement of each group in the array is the same, and substrates of each group of memory cells merge together to form a substrate of the array.

In this array, two first selection transistors of two adjacent groups adjacent to each other in a left-right direction in each row share a drain, and two second selection transistors adjacent to each other in the left-right direction also share a drain. Gates of two first selection transistors (S1) of two adjacent groups aligned in an up-down direction and adjacent to each other in each column are connected in the up-down direction. Since four selection transistors in each group in each column share a gate, gates of all the selection transistors in each column are connected to form a shared gate. A common line, a bit line, a programming bottom line, and a programming line of each group in each row are connected to form a common line, a bit line, a programming bottom line, and a programming line of the row, respectively. Word lines of groups in each column are connected to form a word line of the column.

Two adjacent medium voltage P-wells (MVPWs) of two adjacent groups in each row merge together. All low voltage P-wells (LVPWs) of groups in each column merge together, and all medium voltage P-wells (MVPWs) of groups in each column merge together.

The anti-fuse type one-time (OTP) memory cell, and the memory and the array thereof according to embodiments of the present disclosure may be prepared by a process compatible with the advanced standard processes, and have high programming efficiency, fast programming and reading speed, low power consumption, and stable and reliable performance.

The one-time programmable memory cell and the memory thereof according to embodiments of the present disclosure may be manufactured by standard processes of 130 nm, 110 nm, 90 nm, or from 55 nm to 7 nm.

What is claimed is:

1. A one-time programmable memory cell, comprising:
   a selection transistor and a gate capacitor, which are connected in series and located in a substrate, the substrate comprising an active region and an isolation region;
   wherein the gate capacitor comprises:
      a gate,
      a gate oxide layer between the gate and the substrate, and
      an ion-doped region beneath the gate oxide layer, the ion-doped region being located in the active region in the substrate and overlapping with a part of a lower surface of the gate oxide layer;
   wherein a part of the lower surface of the gate oxide layer that does not overlap with the ion-doped region completely overlaps with the isolation region in the substrate, and the ion-doped region and the isolation region are seamlessly adjacent to each other in the substrate beneath the gate oxide layer.

2. The memory cell of claim 1,
   wherein the selection transistor has a drain and a source, the gate capacitor has one ion-doped region, and the source of the selection transistor merges with the one ion-doped region of the gate capacitor.

3. The memory cell of claim 1, wherein the selection transistor has a drain and a source, the gate capacitor has two ion-doped regions, and the source of the selection transistor merges with one ion-doped region of the gate capacitor; the two ion-doped regions of the gate capacitor overlap with a part of the lower surface of the gate oxide layer, respectively, are separated by the isolation region, and are both seamlessly adjacent to the isolation region.

4. The memory cell of claim 3, wherein the two ion-doped regions of the gate capacitor are connected via a metal line.

5. The memory cell of claim 1, wherein a thickness of the gate oxide layer of the gate capacitor is less than that of a gate oxide layer of the selection transistor.

6. The memory cell of claim 1, wherein the selection transistor is an NMOS transistor, and the ion-doped region of the gate capacitor is an N-type doped region.

7. A one-time programmable memory, comprising at least one memory cell of claim 1, forming an array of multiple rows by multiple columns, and substrates of all memory cells merging together;
   wherein any two adjacent memory cells in each row are arranged in a left-right mirror symmetry, wherein two adjacent selection transistors share a drain, and two adjacent gate capacitors are not in contact with each other; and
   selection transistors of all the memory cells in each column are aligned in an up-down direction, gates of the selection transistors being integrated.

8. The memory of claim 7, further comprising:
   a bit line in each row connected to a drain of a selection transistor of each memory cell in the row;
   a programming line in each row connected to a gate of a gate capacitor of each memory cell in the row; and
   a word line in each column connected to a gate of a selection transistor of each memory cell in the column.

9. The memory cell of claim 1, further comprising:
   a first selection transistor and a detection transistor, which are connected in series and located in a substrate;
   wherein the selection transistor is a second selection transistor, which is connected in series with the gate capacitor; and the detection transistor and the gate capacitor share a gate.

10. The memory cell of claim 9, wherein a thickness of gate oxide layers of the detection transistor and the gate capacitor is less than that of gate oxide layers of the first selection transistor and the second selection transistor.

11. The memory cell of claim 10, wherein the first selection transistor and the second selection transistor are of the same type as the detection transistor.

12. The memory cell of claim 11, wherein the first selection transistor, the second selection transistor, and the detection transistor are NMOS transistors, and the ion-doped region beneath the gate oxide layer of the gate capacitor is an N-type doped region.

13. The memory cell of claim 9, wherein the first selection transistor and the second selection transistor share a gate.

14. A one-time programmable memory cell group, comprising four memory cells of claim 9, arranged in a centrosymmetric array of 2 rows by 2 columns, and substrates of all memory cells merging together;
   wherein two memory cells in each row are arranged in a left-right mirror symmetry, wherein two detection transistors of two memory cells share a source, and have drains each merging with a source of a first selection transistor in a respective memory cell; two gate capacitors are left-right adjacent to each other in the middle of the row without being contacted with each other, and one ion-doped region of each gate capacitor merges with a source of a second selection transistor in a respective memory cell; two selection transistors in one memory cell are located at one side of the group, and two selection transistors in another memory cell are located at the other side of the group; and two memory cells in each column are arranged in an up-down mirror symmetry, all selection transistors in the column being aligned in an up-down direction, and gates of two second selection transistors or two first selection transistors adjacent to each other in the up-down direction in the two memory cells being connected.

15. The memory cell group of claim 14, wherein the four memory cells in the group have a same structure, composition and ingredient.

16. The memory cell group of claim 14, further comprising:
 a common line in each row connected to a shared source of two detection transistors in the row;
 a bit line in each row connected to a drain of a first selection transistor of each memory cell in the row;
 a programming bottom line in each row connected to a drain of a second selection transistor of each memory cell in the row;
 a programming line in each row connected to a shared gate of the gate capacitor and the detection transistor of each memory cell in the row; and two word lines in each column respectively connected to two gates of first and second selection transistors in each memory cell in the column, or one word line in each column connected to a shared gate of a first selection transistor and a second selection transistor in each memory cell in the column.

17. A one-time programmable memory, comprising: at least one memory cell group of claim 14, forming an array, an arrangement manner of groups in the array being same, and substrates of the memory cells of groups merging together to form a substrate of the array; wherein:
 in two adjacent groups in each row, two first selection transistors adjacent to each other in a left-right direction share a first drain, and two second selection transistors adjacent to each other in the left-right direction share a second drain;
 in two adjacent groups in each column, gates of two adjacent second selection transistors or two adjacent first selection transistors aligned in an up-down direction are connected;
 a common line, a bit line, a programming bottom line, and programming line of each group in each row are connected to form a common line, a bit line, a programming bottom line, and a programming line of the row, respectively; and
 one or two word lines of groups in each column are respectively connected or concatenated to form one or two word lines of the column.

18. The memory of claim 17, wherein in the array, a structure, a composition, and an ingredient of the groups are all identical.

* * * * *